United States Patent [19]

Burns

[11] Patent Number: 4,482,781
[45] Date of Patent: Nov. 13, 1984

[54] STABILIZATION OF SEMICONDUCTOR DEVICE PACKAGE LEADS

[75] Inventor: Carmen D. Burns, San Jose, Calif.

[73] Assignee: National Semiconductor Corporation, Santa Clara, Calif.

[21] Appl. No.: 379,204

[22] Filed: May 17, 1982

[51] Int. Cl.³ ............................................. H05K 5/02
[52] U.S. Cl. .................................. 174/52 FP; 29/588; 357/74
[58] Field of Search .................... 174/52 FP; 357/74; 29/588

[56] References Cited

U.S. PATENT DOCUMENTS 3,984,166 10/1976 Hutchison ..................... 174/52 FP Primary Examiner—John Gonzales
Assistant Examiner—D. A. Tone
Attorney, Agent, or Firm—Gail W. Woodward; Paul J. Winters; Michael J. Pollock

[57] ABSTRACT

The leads on a VLSI semiconductor package are bent and secured to the package so as to improve their stability. The thin fragile leads are thereby substantially immobilized so that they will not be deformed during post packaging handling and testing.

8 Claims, 7 Drawing Figures

U.S. Patent  Nov. 13, 1984  4,482,781
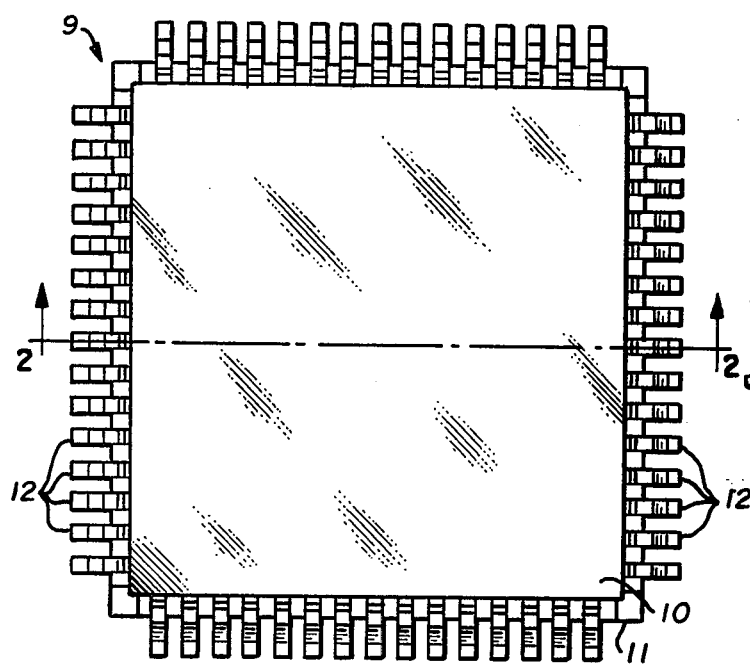
Fig_1 (PRIOR ART)
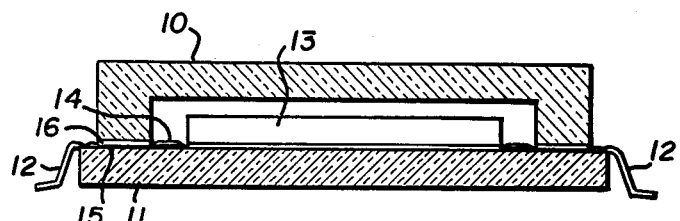
Fig_2 (PRIOR ART)
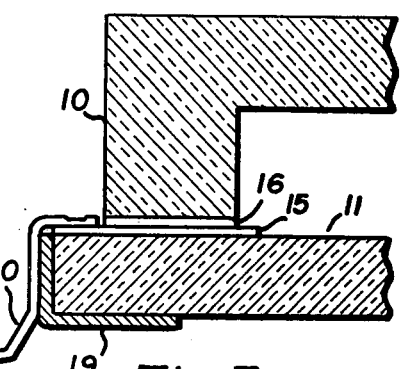
Fig_3
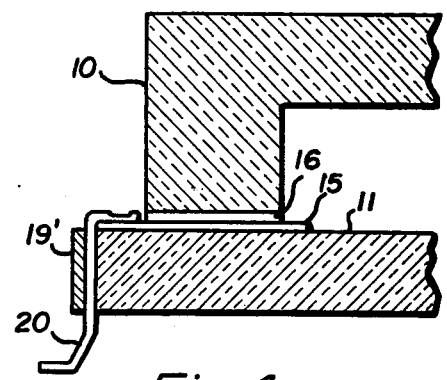
Fig_4
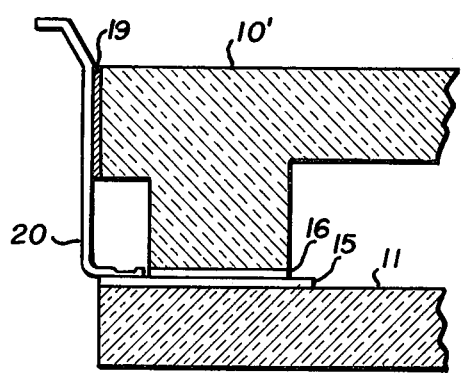
Fig_5
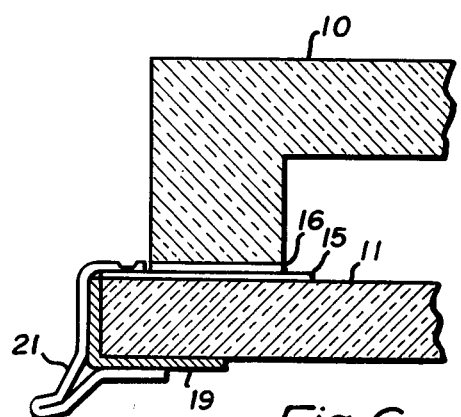
Fig_6
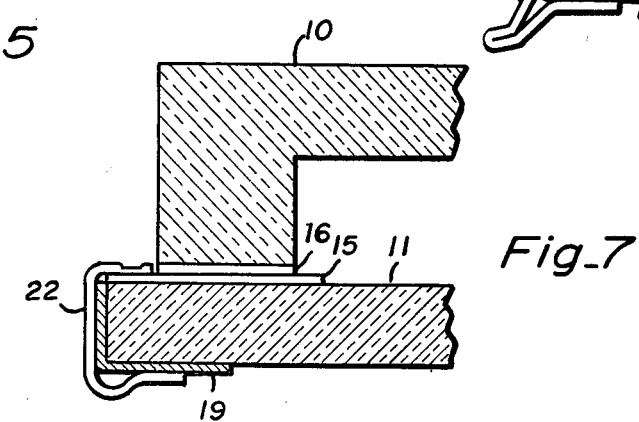
Fig_7

STABILIZATION OF SEMICONDUCTOR DEVICE PACKAGE LEADS

BACKGROUND OF THE INVENTION

In my copending patent application titled "A PROCESS FOR HERMETICALLY ENCAPSULATING SEMICONDUCTOR DEVICE," Ser. No. 133,053 filed Mar. 24, 1980, now U.S. Pat. No. 4,355,463, a ceramic housing is applied to a semiconductor device in an automatic assembly tape process. My related copending patent application titled "INTEGRATED CIRCUIT PACKAGING PROCESS" Ser. No. 373,921 filed May 3, 1982, discloses and claims an improved lead holding process useful in an automatic assembly tape process. Both of these prior applications are assigned to the assignee of the present invention and are incorporated herein by reference.

In these prior assembly approaches the semiconductor device, such as an integrated circuit (IC) chip, is automatically assembled into a housing. In operation the IC device or chip is first bonded to a metal assembly tape. Then the device package is assembled onto the same tape in an automatic process, part of which involves forming the leads to a desired shape. The approaches are applicable to virtually any lead count packages but are most useful in large lead count very large scale integrated circuit (VLSIC) structures. As shown in the second of the above-identified applications, it is desirable to immobilize the leads of the package prior to mounting in its final location.

SUMMARY OF THE INVENTION

It is an object of the invention to adhere the leads of a semiconductor device package to the peripheral edge of the package.

It is a further object of the invention to form the leads of a semiconductor device package to the shape of the peripheral edge and to adhere them in place for mechanical stability.

It is a still further object of the invention to form and adhere the package leads of a semiconductor device package to its peripheral edge and to further form and adhere them to the package face.

These and other objects are achieved in the following manner. The array of thin leads extending outwardly from the peripheral edge of a semiconductor device package are formed to lie along the edge and are adhered thereto by means of a plastic cement. If desired the plastic cement can take the form of a layer of polyimide having both faces coated with B-staged epoxy. This material is inserted between the lead and the package face and the leads pressed against the plastic with a heated tool that produces a thermoset bond. Alternatively, the polyimide can have only one surface coated with epoxy and the coated face pressed on top of the formed leads. In another alternative embodiment, the leads can be further wrapped around the package so as to lie along a face of the package and also adhered thereto. In a still further embodiment, the leads are formed back along their length to create a double thickness structure and the ends thereof bonded to the package face. In all of these embodiments the package leads are secured to the package and thereby substantially stabilized in a compliant configuration.

BRIEF DESCRIPTION OF THE DRAWING

FIG. 1 is a top view of a prior art packaged semiconductor device;

FIG. 2 is a cross-section of the device of FIG. 1 showing one form of assembly;

FIG. 3 is a cross-section of a package that employs the invention; and

FIGS. 4 through 7 are cross-sections of alternative embodiments.

DESCRIPTION OF THE INVENTION

FIG. 1 illustrates an IC package 9 of the kind disclosed in my U.S. Pat. No. 4,355,463. Actually, while this package form is preferred, any other equivalent type could be used. All that is required of the package is that it have a flat peripheral edge with a plurality of thin flat leads extending radially outward therefrom. While a sixty lead package is shown, the invention could be used on any lead count package. The leads are described as thin which means on the order of three mils or so. Their width will be governed by the number employed and the separation alloted to their construction. Present VHSIC packages typically employ a minimum of 20 mil lead centers but this may change with time.

FIG. 2 shows a cross-section of the package of FIG. 1. The package is made up of a base 11 and cap 10 that together house a semiconductor device 13 which is typically an IC chip. Conductive strips 15 which are fired onto base 11 provide lead in contacts under glass 16 which acts to hermetically seal the package. Leads 14 connect device 13 to the interior ends of strips 15 and leads 12 are bonded to the exterior ends of strips 15. All of the leads 12 and 14 are normally made of copper which can be thermocompression gang bonded in package fabrication.

While the present invention applies to such a hermetic package, other package forms could be employed such as molded plastic. The only requirement is a substantially flat outer peripheral face.

It can be seen that the leads are fragile by ordinary standards and can easily be deformed. One way of coping with this problem is disclosed and claimed in my copending application Ser. No. 373,921 filed May 3, 1982.

FIG. 3 shows the basic structure of the invention. The base 11 is provided with a peripheral coating of adhesive or cement 19 that acts to hold leads 20 when they are formed down across the base 11 as shown. The adhesive layer 19 is shown as relatively thick, on the order of the lead thickness. It is preferred that the adhesive be obtained by using a 3 ml thick layer of polyimide coated on both faces with 1 mil of B-staged epoxy. When leads 20 are pressed with a hot tool against base 11, the epoxy will cement the leads to the polyimide and the polyimide to the base. A tacking pressure of about 30 pounds per square inch at 140° C. for 4 seconds will provide an adequate tack. This can be followed by a standard epoxy cure if desired.

As an alternative, the adhesive in semiliquid form can be painted on base 11 or otherwise applied. Then the leads are pressed against the adhesive which is cured using the recommended heat cycle. While the adhesive is also shown as extending along the underside of base 11, this extension can be omitted for this embodiment.

FIG. 4 shows the invention embodiment where the lead cement is applied by way of strip 19' to the outside of the leads. First leads 20 are formed down along the outer periphery of base 11. Then a strip of polyimide, with a thin coating of B-staged epoxy on its inner face, is pressed on top of the leads with a heated tool. The strip will cement the leads in place and will contact base 11 in the spaces between leads. In effect this embodiment is the equivalent of FIG. 3.

FIG. 5 is an alternative embodiment of the invention in which the hermetically sealed cap 10' has an extension whereby its outer periphery is in the same plane as base 11. Using this form of construction, leads 20 can be bent either upward or downward where strip 19 can adhere them. As was the case with the FIG. 4 showing, the adhesive strip can also be located on top of leads 20. With the FIG. 5 form of construction, the ultimate device user can specify which way the package leads extend beyond the package confines.

FIG. 6 provides an alternative that has an even greater lead stability. Here leads 21 are formed into a reentrant shape so that it first contacts the peripheral base 11 edge and then the bottom face of the package. The resultant lead shape overall is similar to that of FIG. 3 but is more robust and stable.

FIG. 7 shows another high stability alternative embodiment of the invention. Here lead 22 is bent downward and formed around an arc and then into contact the bottom face of base 11. Thus the bottom is contacted as well as the peripheral edge. This form of construction takes up less lateral space than the other embodiments. However, it is more difficult to mount upon and solder to the ultimate printed circuit board.

While both FIGS. 6 and 7 show the leads wrapped around base 11, the extension of cap 10 could be as shown in FIG. 5. In this case, the device user has the option of wrapping the leads around either the cap portion or the base portion of the package. In FIGS. 3 through 7 solder is ordinarily applied to the underside of the extremity of the leads. Then the package is tack soldered to a printed circuit board. Ordinarily this is done by a tack soldering process in which a heat tool holds and locates the package in its approximate position. Then the solder is reflowed by localized heating whereupon the solder surface tension accurately produces a final device alignment. Alternatively, the packaged device can be mounted on a printed wiring board by means of a conductive adhesive.

While not shown, it is to be understood that the leads can take other shapes. If desired, the outer lead ends of FIGS. 3 through 6 could further bend to create a reentrant outline portion that would better conform a ring shaped soldering tool.

The invention has been described and five embodiments detailed. When a person skilled in the art reads the foregoing, other alternatives and equivalents, within the spirit and intent of the invention, will become apparent. Accordingly, it is intended that the scope of the invention be limited only by the following claims.

I claim:

1. A method for stabilizing the leads associated with a packaged semiconductor device wherein the package involves a pair of faces and a plurality of leads that are flat and relatively thin and are bonded to a substantially flat peripheral edge of an insulating housing, said method comprising the steps:

locating a heat curable adhesive on said substantially flat peripheral edge;

bending said leads so that their flat faces contact said adhesive;

pressing said leads against said adhesive; and curing said adhesive whereby said leads are stabilized.

2. The method of claim 1 wherein said adhesive is located on both faces of a sheet of insulating material which is interposed between said leads and said peripheral edge.

3. The method of claim 1 wherein said adhesive is applied to one of the exterior faces of said housing as well as said peripheral edge and said leads are further bent to contact said one of the exterior faces as well as said peripheral edge.

4. The method of claim 3 wherein said further bending creates a folded back portion in said leads.

5. A semiconductor device package having a pair of faces and a peripheral edge, said package comprising:

an insulating base in combination with an insulating cover hermetically bonded to said base to enclose a semiconductor device, said base including an array of fired on conductive strips that span the hermetic bond between said base and said cover;

a lead array comprising a plurality of relatively thin flat package leads, each one of which has an inner end electrically and mechanically secured to one of said conductive strips:

means for adhesively bonding each of said leads over a substantial portion of its length to said peripheral edge, said bonding means comprising a layer of insulating material having an adhesive on both faces interposed between said peripheral edge and said leads; and a bent portion of said leads extending a lead securing face to a plane located beyond one of the faces of said package whereby said package can be surface mounted.

6. A semiconductor device package having a pair of faces and a peripheral edge, said package comprising:

an insulating base in combination with an insulating cover hermetically bonded to said base to enclose a semiconductor device, said base including an array of fired on conductive strips that span the hermetic bond between said base and said cover;

a lead array comprising a plurality of relatively thin flat package leads, each one of which has an inner end electrically and mechanically secured to one of said conductive strips;

means for adhesively bonding each of said leads over a substantial portion of its length to said peripheral edge, said bonding means comprising a layer of insulating material having an adhesive on one face thereof and located on top of said leads whereby said adhesive contacts said leads directly and contacts said peripheral edge between said leads; and a bent portion of said leads extending a lead securing face to a plane located beyond one of the faces of said package whereby said package can be surface mounted.

7. The package of claims 5 or 6 wherein said insulating material is a layer of polyimide and said adhesive is a B-staged epoxy cement surface coating.

8. A method for stabilizing the leads associated with a packaged semiconductor device wherein the package involves a pair of faces and a plurality of leads that are flat and relatively thin and are bonded to a substantially flat peripheral edge of an insulating housing, said method comprising the steps:

bending said leads so that their flat faces abut said peripheral edge of said insulating housing;
applying a bonding adhesive to a sheet of insulating material;
pressing said adhesive coated sheet against said leads and said housing whereby said adhesive contacts said leads directly and contacts said peripheral edge between said leads; and
curing said adhesive thereby stabilizing said leads.

* * * * *